(12) United States Patent
Park et al.

(10) Patent No.: US 11,091,386 B2
(45) Date of Patent: Aug. 17, 2021

(54) GLASS FRIT AND DISPLAY DEVICE INCLUDING THE SAME

(71) Applicants: SAMSUNG DISPLAY CO., LTD., Yongin-Si (KR); BASS CO., LTD., Asan-si (KR)

(72) Inventors: Chanyoung Park, Yongin-si (KR); Danbi Choi, Seongnam-si (KR); Soukjune Hwang, Seoul (KR); Hyunmin Hwang, Seoul (KR); Hokyum Kim, Ansan-si (KR); Taeho Park, Seoul (KR); Sanghoon Lee, Anyang-si (KR)

(73) Assignees: Samsung Display Co., Ltd., Yongin-si (KR); Bass Co., Ltd., Asan-si (KR)

( * ) Notice: Subject to any disclaimer, the term of this patent is extended or adjusted under 35 U.S.C. 154(b) by 21 days.

(21) Appl. No.: 16/454,874

(22) Filed: Jun. 27, 2019

(65) Prior Publication Data
US 2020/0002219 A1    Jan. 2, 2020

(30) Foreign Application Priority Data
Jun. 27, 2018    (KR) .................. 10-2018-0074228

(51) Int. Cl.
| | |
|---|---|
| C03C 8/04 | (2006.01) |
| C03C 3/12 | (2006.01) |
| H01L 51/52 | (2006.01) |
| C03C 3/155 | (2006.01) |

(52) U.S. Cl.
CPC ............ C03C 8/04 (2013.01); C03C 3/122 (2013.01); C03C 3/155 (2013.01); H01L 51/5237 (2013.01)

(58) Field of Classification Search
CPC .. C03C 8/02; C03C 8/04; C03C 3/122; C03C 8/24
See application file for complete search history.

(56) References Cited

U.S. PATENT DOCUMENTS

| | | | |
|---|---|---|---|
| 8,766,524 B2 | 7/2014 | Kohara et al. | |
| 8,884,849 B2 | 11/2014 | Masuda | |
| 2014/0145122 A1 | 5/2014 | Sawai et al. | |
| 2015/0037594 A1* | 2/2015 | Kawanami | C03C 3/15 428/427 |

FOREIGN PATENT DOCUMENTS

| | | | | |
|---|---|---|---|---|
| CN | 108298822 A | * | 7/2018 | |
| JP | 60027620 A | * | 2/1985 | |
| JP | 2000072473 A | * | 3/2000 | ............ C03C 3/19 |
| JP | 2001064524 A | * | 3/2001 | ............ C03C 3/16 |
| JP | 2006342044 A | * | 12/2006 | ............ C03C 3/097 |
| JP | 2007223897 A | * | 9/2007 | |
| JP | 2010195674 A | * | 9/2010 | |

(Continued)

*Primary Examiner* — Karl E Group
(74) *Attorney, Agent, or Firm* — Lewis Roca Rothgerber Christie LLP

(57) ABSTRACT

A glass frit includes $Bi_2O_3$ and has a glass transition temperature (Tg) in a range of 280° C. to 320° C. A display device includes the glass frit including $Bi_2O_3$ and the glass transition temperature (Tg) in the range of 280° C. to 320° C. The display device shows excellent internal reliability and drop strength.

19 Claims, 4 Drawing Sheets

(56) References Cited

FOREIGN PATENT DOCUMENTS

| | | | |
|---|---|---|---|
| KR | 10-0833518 | B1 | 5/2008 |
| KR | 10-1162042 | B1 | 7/2012 |
| KR | 10-1220443 | B1 | 1/2013 |
| KR | 10-1298970 | B1 | 8/2013 |
| KR | 10-1401177 | B1 | 5/2014 |
| KR | 10-1521376 | B1 | 5/2015 |
| KR | 10-1524098 | B1 | 6/2015 |
| KR | 10-1626840 | B1 | 6/2016 |
| KR | 10-2016-0121949 | A | 11/2016 |
| KR | 10-1683538 | B1 | 12/2016 |

\* cited by examiner

GLASS FRIT AND DISPLAY DEVICE INCLUDING THE SAME

CROSS-REFERENCE TO RELATED APPLICATIONS

This U.S. non-provisional patent application claims priority to and the benefit of Korean Patent Application No. 10-2018-0074228, filed in the Korean Intellectual Property Office on Jun. 27, 2018, the entire contents of which are hereby incorporated by reference.

BACKGROUND

1. Field

Embodiments of the present disclosure herein relate to a glass frit and a display device including the same. For example, embodiments of the present disclosure relate to a glass frit for improving reliability and durability of a display device and a display device including the same as an encapsulation part.

2. Related Art

A display device is a device designed to display an image, and nowadays, the range of use thereof is becoming wider.

In order to secure stable driving and long lifespan, such a display device is protected from permeation of external deterioration, moisture, or the like. For example, an organic light emitting display device, which has self-luminous characteristics, includes an organic layer, and thus an encapsulation part is used to prevent or reduce permeation of oxygen, moisture, and/or the like into the display device.

The encapsulation part includes a glass frit to stably combine a substrate and an encapsulation substrate, and prevents or reduces permeation of external air, moisture, and/or other foreign materials into a display unit.

SUMMARY

Embodiments of the present disclosure provide a glass frit having a low glass transition temperature and a low thermal expansion coefficient.

Embodiments of the present disclosure also provide a display device having improved durability and reliability, and improved drop strength.

An embodiment of the present disclosure provides a glass frit including $Bi_2O_3$ and having a glass transition temperature (Tg) in a range of 280° C. to 320° C.

In an embodiment, the glass frit may have a crystallization starting temperature (Tx) in a range of 360° C. to 450° C.

In an embodiment, the glass frit may have a difference (Tx−Tg) between the crystallization starting temperature (Tx) and the glass transition temperature (Tg) in a range of 80° C. to 160° C.

In an embodiment, the glass frit may have a thermal expansion coefficient in a range of $45 \times 10^{-7}$/° C. to $55 \times 10^{-7}$/° C.

In an embodiment, the glass frit may include the $Bi_2O_3$ in an amount in a range of 1 mol % to 5 mol %.

In an embodiment, the glass frit may further include $V_2O_5$, ZnO, $ZrO_2$, and $TeO_2$.

In an embodiment, the glass frit may include the $V_2O_5$ in an amount in a range of 20 mol % to 55 mol %; include the ZnO in an amount in a range of 20 mol % to 55 mol %; include the $ZrO_2$ in an amount in a range of 1 mol % to 25 mol %; include the $TeO_2$ in an amount in a range of 1 mol % to 20 mol %; and include the $Bi_2O_3$ in an amount in a range of 1 mol % to 5 mol %.

In an embodiment, the glass frit may further include at least one selected from Fe, Cu, Mn, B, Ti or Ca.

In an embodiment, the glass frit may include at least one selected from Fe, Cu, Mn, B, Ti and Ca in an amount in a range of 0.5 mol % to 25 mol %.

In an embodiment, the glass frit may further include $Nb_2O_5$.

In an embodiment, the glass frit may include $Nb_2O_5$ in an amount in a range of 1 mol % to 10 mol %.

In an embodiment, the glass frit may include the $V_2O_5$ in an amount in a range of 20 mol % to 55 mol %; the ZnO in an amount in a range of 20 mol % to 55 mol %; the $ZrO_2$ in an amount in a range of 1 mol % to 25 mol %; the $Nb_2O_5$ in an amount in a range of 1 mol % to 10 mol %; the $TeO_2$ in an amount in a range of 1 mol % to 20 mol %; the $Bi_2O_3$ in an amount in a range of 1 mol % to 5 mol %; and the at least one selected from Fe, Cu, Mn, B, Ti and Ca in an amount in a range of 0.5 mol % to 25 mol %.

In an embodiment, the glass frit may not contain Al.

In an embodiment, the glass frit may have the crystallization temperature (Tc) in a range of 420° C. to 460° C.

In an embodiment, the glass frit may have a dilatometric softening point temperature (Tdsp) is in a range of 330° C. to 370° C.

In an embodiments of the present disclosure, a display device includes: a first substrate comprising a base layer and a display unit on the base layer; a second substrate facing the first substrate; and an encapsulation unit between the first substrate and the second substrate, and including a glass frit including $Bi_2O_3$ and having a glass transition temperature (Tg) in a range of 280° C. to 320° C.

In an embodiment, the encapsulation unit may surround the display unit.

In an embodiment, the first substrate and the second substrate may be separately arranged and the encapsulation unit is located along each flange of the first substrate and the second substrate.

In an embodiment, the glass frit may further include $V_2O_5$, ZnO, $ZrO_2$, $Nb_2O_5$ and $TeO_2$, may further include at least one selected from Fe, Cu, Mn, B, Ti or Ca, and may include the $V_2O_5$ in an amount in a range of 20 mol % to 55 mol %, the ZnO in an amount in a range of 20 mol % to 55 mol %, the $ZrO_2$ in an amount in a range of 1 mol % to 25 mol %, the $Nb_2O_5$ in an amount in a range of 1 mol % to 10 mol %, the $TeO_2$ in an amount in a range of 1 mol % to 20 mol %, the $Bi_2O_3$ in an amount in a range of 1 mol % to 5 mol %, and the at least one selected from Fe, Cu, Mn, B, Ti or Ca in an amount in a range of 0.5 mol % to 25 mol %.

In an embodiment, the display unit may include an organic light emitting diode, and wherein the organic light emitting diode comprises a first electrode, a second electrode and a light emitting layer therebetween.

BRIEF DESCRIPTION OF THE DRAWINGS

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
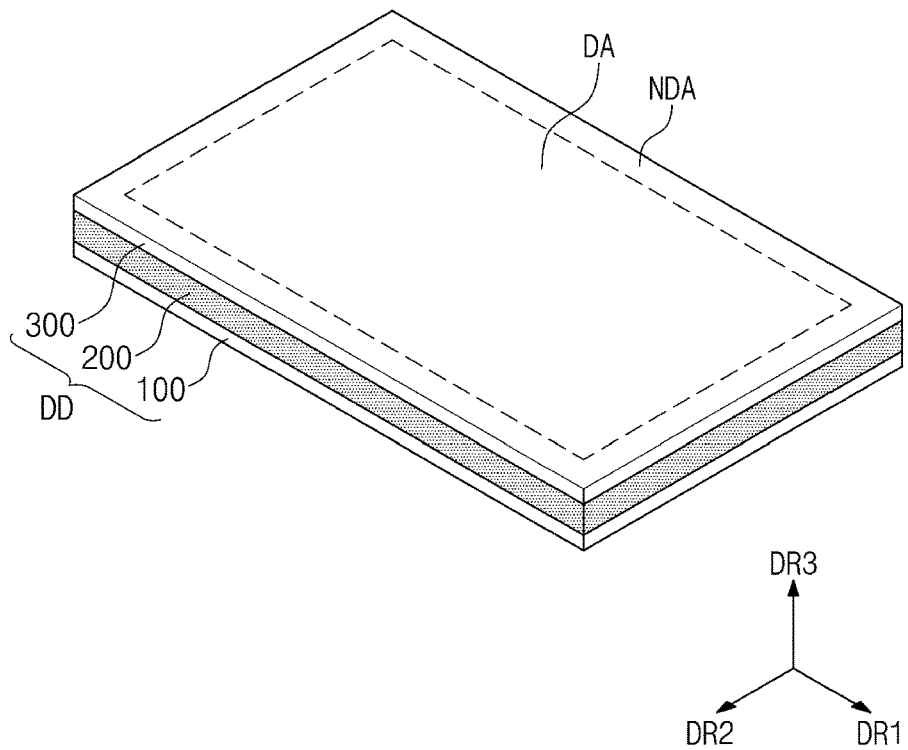
FIG. 1 is a perspective view of a display device according to an embodiment of the present disclosure.

Hereinafter, example embodiments will be described in more detail with reference to the accompanying drawings, in which like reference numbers refer to like elements throughout. The subject matter of the present disclosure, however, may be embodied in various different forms, and should not be construed as being limited to only the illustrated embodiments herein. Rather, these embodiments are provided as examples so that this disclosure will be thorough and complete, and will fully convey the aspects and features of embodiments of the present disclosure to those skilled in the art. Accordingly, processes, elements, and techniques that are not necessary to those having ordinary skill in the art for a complete understanding of the aspects and features of the present disclosure may not be described.

It will be understood that when an element or layer is referred to as being "on", "connected to," or "coupled to" another element or layer, it can be directly on, connected to, or coupled to the other element, or intervening third elements may be present.

Like reference numerals in the drawings refer to like elements. In addition, in the drawings, the thicknesses, relative sizes, and dimensions of the elements shown may be exaggerated for clarity of description of the technical features.

The term "and/or" includes any and all combinations of one or more of the associated items.

Terms such as first, second, and the like may be used to describe various components, but these components should not be limited by the terms. The terms are used only for the purpose of distinguishing one component from another component. For instance, a first component may be referred to as a second component, or similarly, a second component may be referred to as a first component, without departing from the spirit and scope of the present disclosure. The singular forms "a," "an" and "the" are intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Hereinafter, embodiments of the present disclosure will be described with reference to the accompanying drawings.

Figure 2:
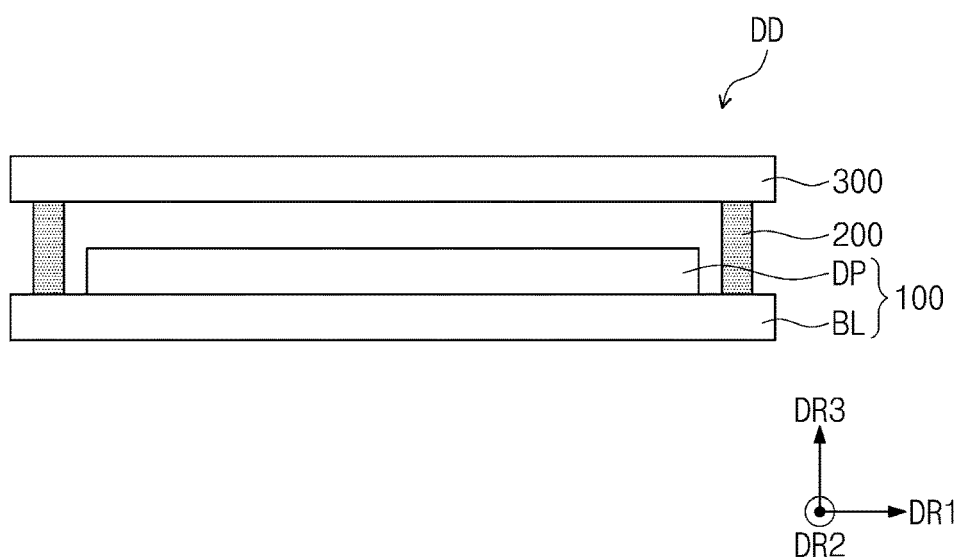
FIG. 2 is a cross-sectional view of a display device according to an embodiment of the present disclosure.

FIG. 1 is a perspective view of a display device according to an embodiment of the present disclosure, and FIG. 2 is a cross-sectional view of a display device according to an embodiment of the present disclosure.

Referring to FIG. 1, a display device DD includes a first substrate 100, a second substrate 300 and an encapsulation part 200 between the first substrate 100 and the second substrate 300. The first substrate 100 and the second substrate 300 may be arranged to face each other.

The display device DD may include a display area DA and a non-display area NDA. The display device DD may display an image through the display area DA, and the display area DA may include a plurality of pixel areas in which pixels are located respectively therein. The non-display area NDA may surround the display area DA.

The encapsulation part 200 includes a glass frit, and extends along each flange of the first substrate 100 and the second substrate 300 defined in the first direction DR1 and the second direction DR2. The encapsulation part 200 may be in the non-display area NDA.

Referring to FIG. 2, the first substrate 100 may be arranged separately from the second substrate 300. The first substrate 100 includes a base layer BL and a display unit DP on the base layer BL.

In an embodiment, the base layer BL may have a member configured to provide a base surface on which the display unit DP is located. The base layer BL may be a transparent insulation layer, and formed from borosilicate glass, soda-lime glass, or a glass material that is a mixture thereof, but the present disclosure is not limited thereto. The base layer BL may receive thermal stress in a laser process to be described herein below, and thus, may be formed from a material that hardly absorbs a laser wavelength band.

The encapsulation part 200 may be arranged to surround the display unit DP. The encapsulation part 200 has a set or prescribed thickness and is between the first substrate 100 and the second substrate 300 to join the first substrate 100 and the second substrate 300. In addition, the encapsulation part 200 may encapsulate a space between the first substrate 100 and the second substrate 300. Accordingly, the encapsulation part 200 may block the display unit DP from being exposed to external moisture and air, etc., and accordingly prevent or reduce damage to the display unit DP. The encapsulated space may be in a vacuum state. However, the present disclosure is not limited thereto, and the encapsulated space may be filled with nitrogen ($N_2$) or an insulation material.

The drop strength, durability and reliability of the display device DD according to an embodiment of the present disclosure may be improved by including a glass frit according to an embodiment of the present disclosure. As used herein, the term "drop strength" may mean a height at which damage starts to occur to the display device DD at the time of being dropped (e.g., at the time of impact). As the drop strength is stronger, even when the display device DD is dropped at a higher height, damage does not occur (or substantially does not occur) to the display device DD, durability and reliability of the display device DD are high, and the lifespan may be improved.

When the display device DD is dropped, damage may frequently occur to the encapsulation part that bonds the first substrate 100 and the second substrate 300. Accordingly, the drop strength of such a display device may be greatly affected by physical properties of the glass frit included in the encapsulation part according to the following Equation (1).

$$\text{Strength of display device} \propto 1/(T_{frit}^{l} \times \alpha_{frit}^{m} \times MGR^{n}) \quad (1)$$

In the Equation (1), $T_{frit}$ denotes a glass transition temperature (Tg) of the glass frit, $\alpha_{frit}$ denotes a thermal expansion coefficient (CTE), and MGR denotes a mother glass ratio. l, m, n are respectively integers, and have respective ranges of about $1.8 < l < 4.2$, about $1.25 < m < 1.65$, and about $0.95 < n < 1.32$.

Equation (1) indicates a relationship between the drop strength and the physical properties of the glass frit. From Equation (1), the drop strength of the display device is inversely proportional to the glass transition temperature (Tg), the thermal expansion coefficient (CTE) of the glass frit, and the mother glass ratio. Accordingly, the present disclosure may provide a glass frit having the low glass transition temperature (Tg) and the low thermal expansion coefficient (CTE). In embodiments of the present disclosure, the glass frit may be applied to the encapsulation part (200) to assist the display device DD to have the improved drop strength.

Figure 3:
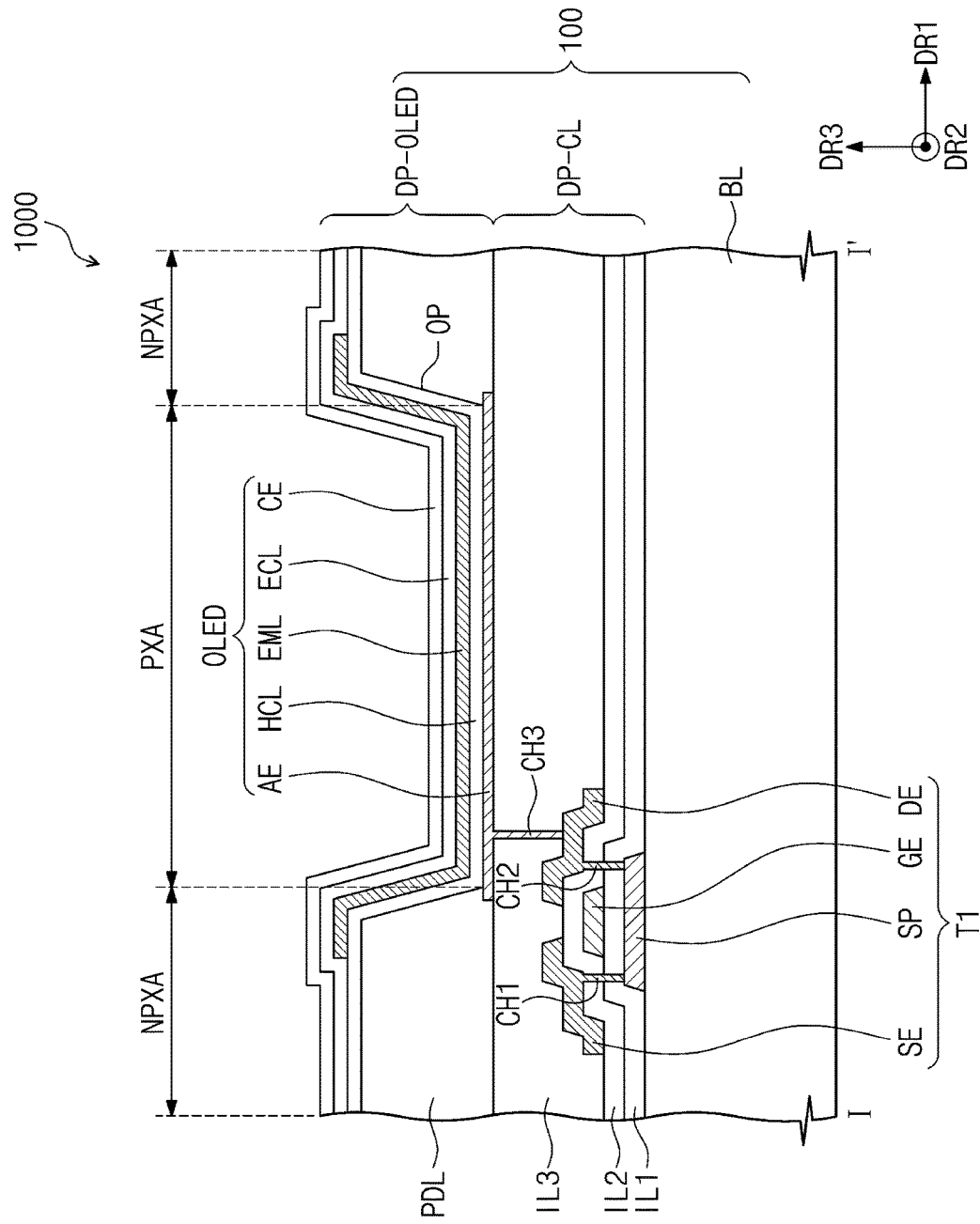
FIG. 3 is a cross-sectional view of a display unit according to an embodiment of the present disclosure.

FIG. 3 is a cross-sectional view of a display unit according to an embodiment of the present disclosure.

Referring to FIG. 3, the display unit DP may include a circuit layer DP-CL and an element layer DP-OLED.

The circuit layer DP-CL may include a first insulation layer IL1, a second insulation layer IL2 and a third insulation layer IL3. The first insulation layer IL1 and the second insulation layer IL2 may include inorganic materials, but the kind thereof is not particularly limited. The third insulation layer IL3 may include an organic material, but the kind thereof is not particularly limited. In some embodiments, a barrier layer including an inorganic layer and/or a buffer layer may be additionally on the base layer BL. Each of the first insulation layer IL1, the second insulation layer IL2 and the third insulation layer IL3 may have a single layer or a multi-layer structure.

A first transistor T1 may include a semiconductor pattern SP, a gate electrode GE, a source electrode SE, and a drain electrode DE. The semiconductor pattern SP is on the base layer BL. The semiconductor pattern SP may include a crystalline semiconductor material or amorphous silicon.

The first insulation layer IL1 is on the base layer BL. The first insulation layer IL1 overlaps the pixel area PXA and the surrounding area NPXA, and covers the semiconductor pattern SP.

The gate electrode GE is on the first insulation layer IL1. The gate electrode GE overlaps the semiconductor pattern SP. The gate electrode GE2 may be manufactured according to a photolithography process.

The second insulation layer IL2 is on the first insulation layer IL1. The second insulation layer IL2 covers the first insulation layer IL1 and the gate electrode GE. The second insulation layer IL2 overlaps the pixel area PXA and the surrounding area NPXA.

The source electrode SE and the drain electrode DE are on the second insulation layer IL2. Each of the source electrode SE and the drain electrode DE is coupled to (e.g., connected to) the semiconductor pattern SP through a plurality of contact holes CH1 and CH2 defined in the insulation layers IL1 and IL2. On the other hand, the first transistor T1 may be changed to a bottom-gate structure.

The third gate insulation layer IL3 configured to cover the first thin film transistor T1 is on the second gate insulation layer IL2. The third insulation layer IL3 may provide a planar surface.

The element layer DP-OLED is on the third insulation layer IL3. The element layer DP-OLED may include a pixel definition layer PDL and an organic light emitting diode OLED.

The pixel definition layer PDL may include an organic material. An opening part OP is defined in the pixel definition layer PDL. The opening part OP of the pixel definition layer PDL exposes at least a part of the first electrode AE. In an embodiment of the present disclosure, the pixel definition layer PDL may be omitted.

The display area DA may include the pixel area PXA (or light emitting area) and the surrounding area NPXA (or non-light emitting area) adjacent to the pixel area PXA. The surrounding area NPXA may surround the pixel area PXA. In the present embodiment, the pixel area PXA is defined in correspondence to a part of area of the first electrode AE exposed by the opening part OP.

In an embodiment, the organic light emitting diode OLED includes a first electrode AE, a hole control layer HCL, a light emitting layer EML, an electron control layer ECL, and a second electrode CE, which are sequentially laminated on the base layer BL. In an embodiment of the present disclosure, one or more of the hole control layer HCL and the electron control layer ECL may be omitted.

The first electrode AE is on the third insulation layer IL3. The first electrode AE is coupled to (e.g., connected to) the drain electrode DE through a third contact hole CH3 configured to penetrate through the third insulation layer IL3. The first electrode AE may be an anode electrode, but is not limited thereto. The first electrode AE may be a transmissive electrode, a semi-transmissive electrode, or a reflective electrode.

The hole control layer HCL is on the first electrode AE. The hole control layer HCL may be on the pixel PXA and the surrounding pixel area NPXA. In some embodiments, a common layer such as the hole control layer HCL may be in the pixel area PXA and the surrounding area NPXA. The hole control layer HCL may have a single layer formed from a single material, a single layer formed from a plurality of different materials, or a multi-layer structure having a plurality of layers formed from a plurality of different materials. For example, the hole control layer HCL may have a single layer structure of a hole injection layer or a hole transport layer, or a single layer structure formed from a hole injection material and a hole transport material. In addition, the hole control layer HCL may have a single layer structure formed from a plurality of different materials, or a structure of hole injection layer/hole transport layer, hole injection layer/hole transport layer/hole buffer layer, hole injection layer/hole buffer layer, hole transport layer/hole buffer layer, or hole injection layer/hole transport layer/electron blocking layer sequentially laminated from the first electrode AE, but present disclosure is not limited thereto. The hole control layer HCL of an embodiment may further include at least one of a hole buffer layer or an electron blocking layer besides the hole injection layer and the hole transport layer.

The light emitting layer EML is on the hole control layer HCL. The light emitting layer EML may emit one selected from among red light, green light, blue light, white light, yellow light or cyan light. The light emission layer EML may include a fluorescent material or a phosphorescent material. The light emitting layer EML may have a single layer formed from a single material, a single layer formed from a plurality of different materials, or a multi-layer structure having a plurality of layers formed from a plurality of different materials. In addition, the light emission layer EML may have a multi-layer structure, which may be referred to as a tandem structure.

An electron control layer ECL is on the light emitting layer EML. The electron control layer ECL may include at least one of a hole blocking layer, an electron transport layer, or an electron injection layer, but is not limited thereto. The electron control layer ECL may have a single layer formed from a single material, a single layer formed from a plurality of different materials, or a multi-layer structure having a plurality of layers formed from a plurality of different materials. For example, the electron control layer ECL may have a single layer structure of an electron injection layer or an electron transport layer, or a single layer structure formed from an electron injection material and an electron transport material. In addition, the electron control layer ECL may have a single layer structure formed from a plurality of different materials, or a structure of an electron transport layer/electron injection layer, or a hole blocking layer/electron transport layer/electron injection layer sequentially laminated from the light emitting layer EML, but the present disclosure is not limited thereto.

The second electrode CE is on the electron control layer ECL. The second electrode CE has conductivity. The second electrode CE may be formed from a metal alloy or a conductive compound. The second electrode CE may be a cathode. The second electrode CE may be a transmissive electrode, a semi-transmissive electrode, or a reflective electrode.

In an embodiment, the organic light emitting diode OLED may further include a resonating structure configured to control the resonant distance of light generated in the light emitting layer EML. The resonating structure may be between the first electrode AE and the second electrode CE, and the thickness thereof may be determined according to a wavelength of light generated from the light emitting layer EML.

Referring to FIG. 2 again, the encapsulation part 200 may include a glass frit and be formed by sintering the glass frit. In more detail, first, the glass frit may be mixed with an organic vehicle to form a gel-type paste (a gel kind of paste). The organic vehicle may include an organic binder and a solvent. The organic binder is not particularly limited and may be, for example, an acrylic resin. The organic vehicle may be mixed with the glass frit to enable the glass frit to be easily applied onto the second substrate 300. The organic vehicle may contain about 5 to 100 parts by weight for 100 parts by weight of the glass frit.

Then, the formed paste is applied to the second substrate 300 to form an encapsulation part pattern. Application of the paste may be performed through a screen printing scheme, but is not limited thereto.

After the encapsulation part pattern is formed, a pre-sintering process is performed. A pre-sintering temperature may be in a range of about 250° C. to about 600° C., but is not limited thereto. Through such a pre-sintering process, the organic material becomes extinct (e.g., the organic material is evaporated and/or decomposed), and the gel-type paste is solidified to be attached onto the second substrate 300 as the glass frit of a solid type (a solid glass frit).

After the pre-sintering process, the first substrate 100 is on the glass frit so as to face the second substrate 300. Finally, a main sintering process, in which laser light having a wavelength in a range of about 700 nm to about 900 nm as a central wavelength is irradiated, is performed to sinter the glass frit to form the encapsulation part 200.

Hereinafter, a description about the glass frit will be described with further detail.

Figure 4:
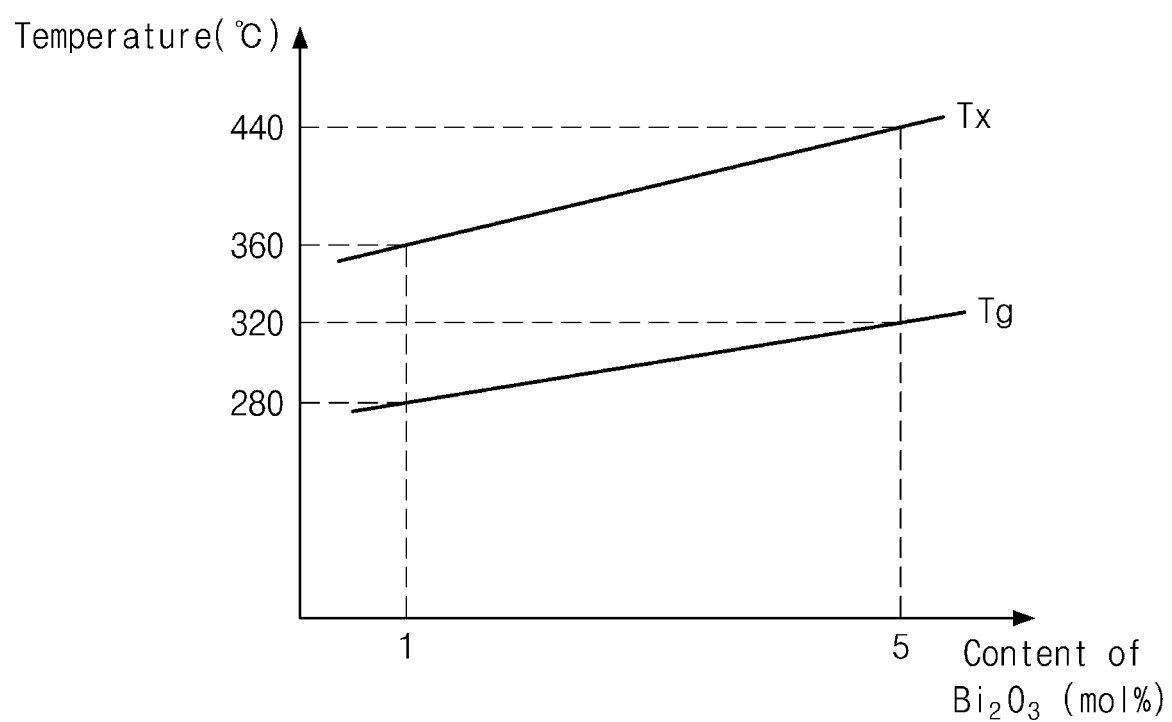
FIG. 4 is a graph showing thermal characteristics of a glass frit according to content of $Bi_2O_3$ of an embodiment of the present disclosure.

FIG. 4 is a graph showing thermal characteristics of a glass frit according to content of $Bi_2O_3$ of an embodiment of the present disclosure. The glass frit according to an embodiment has a relatively low glass transition temperature (Tg) of about 280° C. to about 320° C., and thus, may have a stable sintering temperature period, and maintain an amorphous state in the sintering operation, so that an effect caused by contraction of the glass frit may be minimized or reduced to secure excellent drop strength.

In an embodiment, the glass frit includes $Bi_2O_3$. The glass frit includes $Bi_2O_3$ to improve stability and make sintering easier, so that an adhesion force may be improved and the durability and reliability of the display device DD may be improved.

In an embodiment, the glass frit contains about 1 mol % to about 5 mol % of $Bi_2O_3$. Referring to FIG. 4, when the glass frit contains less than about 1% of $Bi_2O_3$, the glass transition temperature (Tg) and a crystallization starting temperature (Tx) become lowered and, for example, the crystallization starting temperature (Tx) is excessively lowered to make sintering more difficult. In addition, when the glass frit contains about 5% or more of $Bi_2O_3$, the glass transition temperature (Tg) and a crystallization starting temperature (Tx) increase, and accordingly an amorphous state is not maintained (or is substantially not maintained) in the sintering operation and the drop strength of the display device DD decreases.

In an embodiment, the glass frit further contains $V_2O_5$ and ZnO. In the sintering process, $V_2O_5$ reacts with ZnO to break a V—O—V bond of the $V_2O_5$.

Accordingly, the length of $V_2O_5$ molecule bond chains become shortened, the reactivity of $V_2O_5$ molecules increases at a relatively low temperature to make the glass transition temperature (Tg) lower. In addition, as the crystallization rate increases at the time of sintering, the drop strength of the display device DD may be improved. Furthermore, a covalent bond-enabled site of 0 increases to increase the bonding force with other molecules in the glass frit and thus the adhesion force also increases.

In an embodiment, the glass frit may contain about 20 mol % to about 55 mol % of $V_2O_5$, and about 20 mol % to about 55 mol % of ZnO. $V_2O_5$ and ZnO may be contained in a similar ratio. In more detail, $V_2O_5$ and ZnO are contained in an amount of about 20 mol % or more and react as described above, and thus, the glass transition temperature (Tg) of the glass frit is lowered and the adhesion force increases. However, because $V_2O_5$ has the high ductility characteristic, when the glass frit contains about 55 mol % or more of $V_2O_5$, the adhesion force and strength of the glass frit may be lowered. In another embodiment, the glass frit may contain about 25 mol % to about 35 mol % of $V_2O_5$, and about 25 mol % to about 35 mol % of ZnO.

In an embodiment, the glass frit further contains $ZrO_2$. $ZrO_2$ may lower the thermal expansion coefficient (CTE) of the glass frit and increase the absorption rate of laser light of the glass frit.

In an embodiment, the glass frit contains about 1 mol % to 25 mol % of $ZrO_2$. When less than about 1 mol % of $ZrO_2$ is contained in the glass frit, the durability of the glass frit may be lowered, and when greater than about 25 mol % of $ZrO_2$ is contained in the glass frit, the thermal expansion coefficient (CTE) may increase to raise residual stress to be described herein below. In another embodiment, the glass frit contains about 5 mol % to about 10 mol % of $ZrO_2$.

In an embodiment, the glass frit may further contain $Nb_2O_5$. $Nb_2O_5$ may increase the durability of the glass frit and the absorption rate of laser light of the glass frit. In an embodiment the glass frit contains about 1 mol % to about 10 mol % of $Nb_2O_5$.

In an embodiment, the glass frit further contains $TeO_2$. $TeO_2$ may increase the bonding force of the glass frit and the absorption rate of laser light of the glass frit. In addition, $TeO_2$ may lower the glass transition temperature (Tg) of the glass frit.

In an embodiment the glass frit contains about 1 mol % to about 20 mol % of $TeO_2$. When the glass frit contains less than about 1 mol % of $TeO_2$, the durability is lowered, and when melted, the melt flow and stability upon being melted may be lowered. In addition, when the glass frit contains greater than about 20 mol % of $TeO_2$, the thermal expansion coefficient (CTE) increases to raise the residual stress to be described herein below. In another embodiment, the glass frit may contain about 5 mol % to about 15 mol % of $TeO_2$.

In an embodiment, the glass frit further contains at least one of inorganic materials. The inorganic material is not particularly limited, but may be at least one of Fe, Cu, Mn, B, Ti and Ca. The above-described Fe, Cu, Mn, B, Ti and Ca may be distributed in the glass frit to maintain a form of the sintered glass frit. In addition, Fe, Cu, Mn, B, Ti and Ca may lower the thermal expansion coefficient (CTE) and the glass transition temperature (Tg) of the glass frit.

In an embodiment the glass frit contains about 0.5 mol % to about 25 mol % of at least any one selected from Fe, Cu, Mn, B, Ti, Ca, and combinations thereof. When at least one of Fe, Cu, Mn, B, Ti and Ca is contained in the glass frit in an amount less than about 0.5 mol %, the thermal expansion coefficient (CTE) and the glass transition temperature (Tg) of the glass frit may increase. When at least one of Fe, Cu, Mn, B, Ti and Ca is contained in the glass frit in an amount greater than about 25 mol %, the stability and adhesion force of the glass frit may be lowered.

In an embodiment, the glass frit does not include Al. For example, the glass frit may be substantially free of Al, or completely free of Al. As used herein, the phrase "substantially free of Al" means that Al is present in the glass frit, if at all, only as an incidental impurity. In a process of forming the encapsulation part 200 of the display device DD, Al may raise the absorption rate of laser light to increase the adhesion force and strength. However, the glass frit contains Al and Zn together, Al and Zn may react to be crystallized in a sintering process, and then $Al_2ZnO_4$ may be generated. Because $Al_2ZnO_4$ has a relatively large sized particle, $Al_2ZnO_4$ does not melt (or substantially does not melt) even in a process in which the laser light is irradiated and remains as it is, which causes a defect that a wiring of the display device DD is stabbed with the crystal of $Al_2ZnO_4$.

In an embodiment, the glass frit may contain about 25 mol % to about 35 mol % of $V_2O_5$, about 25 mol % to about 35 mol % of ZnO, about 1 mol % to about 10 mol % of $ZrO_2$, about 1 mol % to about 10 mol % of $Nb_2O_5$, about 1 mol % to about 20 mol % of $TeO_2$, and about 1 mol % to about 5 mol % of $Bi_2O_3$, and about 0.5 mol % to about 25 mol % of at least one of Fe, Cu, Mn, B, Ti or Ca. When containing the above-described contents of the above-described components, the glass frit may have the low glass transition temperature (Tg) and the low thermal expansion coefficient (CTE).

Referring to FIG. 4 again, the glass transition temperature (Tg) of the glass frit may be about 280° C. to about 320° C.

Because a value of 1 of the index of $T_{frit}$ in the Equation (1) is the greatest, the drop strength of the display device may be mostly affected by the glass transition temperature (Tg) of the glass frit. The glass frit according to embodiments of the present disclosure has the low glass transition temperature (Tg) of about 320° C. or lower, and thus, may secure the stable sintering temperature period and be applied to the encapsulation part 200 to improve the drop strength of the display device DD. On the other hand, when the glass frit has an excessively low glass transition temperature (Tg), there occurs an issue in which glassification is not well performed in the sintering operation. Therefore, the glass frit may have a temperature of about 280° C. or higher. In another embodiment, the glass transition temperature (Tg) of the glass frit may be about 285° C. or higher, or about 290° C. or higher, or about 315° C. or lower, about 310° C. or lower, or about 305° C. or lower within a range of about 280° C. to 320° C.

In an embodiment, the crystallization starting temperature (Tx) of the glass frit may be about 360° C. to about 450° C. Because the glass frit according to the present disclosure has the crystallization starting temperature (Tx) of about 360° C. or higher, the crystallization may be suppressed or reduced in the sintering operation and the amorphous status may be maintained. In addition, the glass frit has the crystallization starting temperature (Tx) of about 450° C. or lower, and thus, in the sintering operation, a process may be completed only with a small amount of the laser light. Accordingly, the encapsulation part 200 may be uniformly (e.g., substantially uniformly) and rapidly formed to improve the strength of the display device DD. In another embodiment, the crystallization starting temperature (Tx) of the glass frit is about 370° C. or higher, or about 380° C. or higher.

In an embodiment, the glass frit may have a difference (Tx−Tg) of about 80° C. to about 160° C. between the crystallization starting temperature (Tx) and the glass transition temperature (Tg). Because the glass frit may be controlled to have the difference (Tx−Tg) of about 80° C. to about 160° C. between the crystallization starting temperature (Tx) and the glass transition temperature (Tg), the glass frit may secure a wide sintering temperature period (e.g., range) and the crystallization is suppressed or reduced to maintain the amorphous status (e.g., an amorphous state). Accordingly, when applied to the encapsulation part 200, the glass frit may have the high adhesion force and improve the drop strength of the display device DD. In another embodiment, within the range of about 80° C. to about 160° C., the difference (Tx−Tg) between the crystallization starting temperature (Tx) and the glass transition temperature (Tg) of the glass frit may be about 100° C. or higher, about 110° C. or higher, or about 120° C. or higher, and about 150° C. or lower, about 140° C. or lower, or about 130° C. or lower.

In an embodiment, the thermal expansion coefficient of the glass frit may be about $45 \times 10^{-7}$/° C. to about $55 \times 10^{-7}$/° C. As described above, upon forming the encapsulation part 200, the glass frit is irradiated with the laser light to receive thermal energy, and thus, may contract in a refrigerant process. Here, the second substrate has a relatively lower thermal expansion coefficient (CTE) in comparison to the glass frit, and thus, has a small temperature rise. Accordingly, while passing through a laser process in a state of being applied to the second substrate 300, the glass frit is hardly expanded or contracted, and thus, a residual stress is present between the glass frit and the second substrate 300. As the residual stress is larger between the glass frit and the second substrate 300, the drop strength of the display device DD is lowered and the durability and reliability are also lowered like a case of being easily broken by an external shock or the like. The magnitude of the residual stress may be expressed with the following Equation (2).

$$\text{Residual stress} = \frac{E_{frit}(\alpha_{frit} - \alpha_{300})\Delta T}{1 - v^2} \quad (2)$$

In Equation (2), $E_{frit}$ denotes Young's modulus, $\alpha_{frit}$ denotes the thermal expansion coefficient (CTE) of the glass frit, $\alpha_{300}$ denotes the thermal expansion coefficient (CTE) of the second substrate 300, $\Delta T$ denotes a temperature difference between the glass frit and the base layer BL, and v denotes a Poisson ratio.

In Equation (2), because $E_{frit}$ and v are fixed or set values, as the difference between the thermal expansion coefficients (CTE) of the glass frit and the second substrate 300 is smaller, the residual stress between the glass frit and the second substrate 300 may be lowered. The thermal expansion coefficient (CTE) of the second substrate 300 used in the display device DD may have a value of about $40 \times 10^{-7}/°$ C. Because thermal expansion coefficient (CTE) of the glass frit according to embodiments of the present disclosure is about $45 \times 10^{-7}/°$ C. to about $55 \times 10^{-7}/°$ C., the difference from the thermal expansion coefficients (CTE) of the second substrate 300 is smaller in comparison to the glass frit to lower the residual stress. Accordingly, the drop strength, the durability and reliability of the display device DD may be improved.

In an embodiment, the crystallization temperature (Tc) of the glass frit may be about 420° C. to about 460° C. Because the crystallization temperature (Tc) of the glass frit is controlled between about 420° C. to about 460° C., the crystallization is suppressed or reduced in the sintering operation to maintain the amorphous status. Accordingly, the drop strength of the display device DD may be improved.

In an embodiment, the dilatometric softening point temperature (Tdsp) of the glass frit may be about 330° C. to 370° C. Because the dilatometric softening point temperature (Tdsp) of the glass frit may be controlled to be about 330° C. to about 370° C., the adhesion force of the glass frit may be improved.

Hereinafter, with reference to embodiments and comparison examples, the glass frit according to an embodiment of the present disclosure, and a display device manufactured using the same will be described in further detail. The embodiments below are to simply assist in understanding of the present disclosure, and the scope of the present disclosure is not limited thereto.

EMBODIMENTS

1. Manufacturing Glass Frits

A glass frit was manufactured having components of ratios (mol %) shown in Table 1.

TABLE 1

|  | Example 1 | Example 2 | Comparative Example 1 | Comparative Example 2 |
| --- | --- | --- | --- | --- |
| $V_2O_5$ | 34% | 34% | 34% | 34% |
| ZnO | 25% | 25% | 25% | 25% |
| $ZrO_2$ | 6% | 8% | 8% | 8% |
| $Bi_2O_3$ | 3% | 5% | 7% | 9% |
| $TeO_2$ | 10% | 7% | 5% | 3% |
| $Nb_2O_5$ | 6% | 5% | 5% | 5% |

TABLE 1-continued

|  | Example 1 | Example 2 | Comparative Example 1 | Comparative Example 2 |
| --- | --- | --- | --- | --- |
| Fe | 3% | 3% | 3% | 3% |
| Cu | 4% | 4% | 4% | 4% |
| Mn | 3% | 3% | 3% | 3% |
| Ba | 3% | 3% | 3% | 3% |
| Ti | 1% | 1% | 1% | 1% |
| Ca | 2% | 2% | 2% | 2% |

2. Evaluation of Physical Properties of Glass Frits

The thermal transition temperatures (Tg), the dilatometric softening point temperatures (Tdsp), the crystallization starting temperatures (Tx), the crystallization temperatures (Tc) and the thermal expansion coefficients (CTE) were measured using a thermal analysis instrument (TMA-Q400, manufactured by TA instrument) for each of the glass frits of Examples 1 and 2, and Comparative Examples 1 and 2. The results are shown in the following of Table 2.

TABLE 2

|  | Example 1 | Example 2 | Comparative Example 1 | Comparative Example 2 |
| --- | --- | --- | --- | --- |
| Tg (° C.) | 298 | 307 | 338 | 343 |
| Tdsp (° C.) | 337 | 360 | 376 | 389 |
| Tx (° C.) | 422 | 446 | 467 | 476 |
| Tc (° C.) | 423 | 447 | 468 | 477 |
| CTE ($\times 10^{-7}$/° C.) | 45 | 51 | 58 | 61 |

With reference to Table 2, Examples 1 and 2 satisfy the glass transition temperature (Tg) of about 280° C. to about 320° C., the dilatometric softening point temperature of about 330° C. to about 400° C., the crystallization starting temperature (Tx) of about 360° C. to about 450° C., the crystallization temperature (Tc) of about 420° C. to about 500° C., and the thermal expansion coefficient (CTE) of about $45 \times 10^{-7}/°$ C. to about $55 \times 10^{-7}/°$ C. On the contrary, Comparative Examples 1 and 2 containing high content of $Bi_2O_3$ does not satisfy the corresponding ranges of the respective glass transition temperature (Tg), crystallization starting temperature (Tx) and thermal expansion coefficient (CTE). Accordingly, in comparison to Comparative Examples 1 and 2, Examples 1 and 2 have a stable sintering temperature period (e.g., range) and maintain amorphous statuses (e.g., an amorphous state) in a sintering operation, and thus, at the time of being applied to a display device, the drop strength of the display device may be expected to be improved.

3. Manufacturing a Device

The manufactured glass frit of Example 1 was mixed with an organic vehicle to form a paste. The composed paste was applied on a second substrate and sintering was performed thereon for 5 minutes at 300° C. After the sintering, a first substrate was bonded thereto and then irradiated with laser light (light amount: 10 W) to form an encapsulation part.

In addition, in the same scheme, display devices were respectively manufactured which include encapsulation parts containing glass frits of Example 2 and Comparative Examples 1 and 2.

Figure 5:
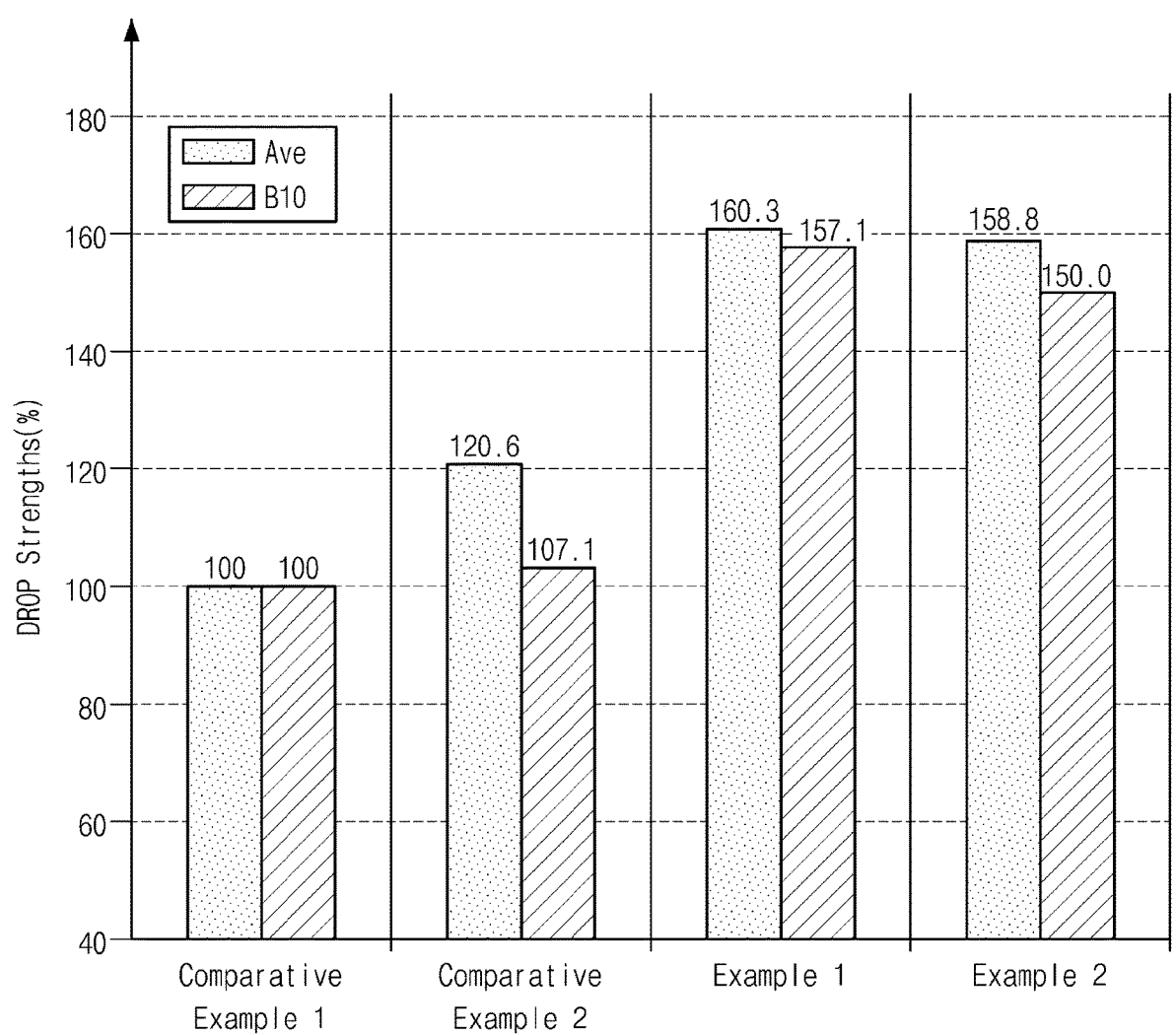
FIG. 5 is a graph showing measured drop strengths of display devices including glass frits of Examples 1 and 2 of the present disclosure and Comparative Examples 1 and 2.

4. Experiment for Comparing Strengths of Display Devices 20 or more display devices including glass frits of the manufactured Examples 1 and 2, and Comparative Examples 1 and 2 were freely dropped to measure the strengths thereof. Measurement was performed until damage occurred to the display devices, while the drop height was increased by 10 cm. The drop strength of the display device including the glass frit of Comparative Example 1 is taken as 100%, and with reference to this, relative strengths of the manufactured display devices were measured. The results are shown in FIG. 5. In FIG. 5, the average Ave. means a drop strength average value of all the display devices for which drop strengths are measured, B10 means the average drop strength value of the display device having the drop strengths belonging to the lowest 10%.

Referring to FIG. 5, in comparison to the display devices including Comparative Examples 1 and 2, it may be seen that for the display devices including the glass frits of Examples 1 and 2, the average drop strength B10 of the display devices belonging to the lowest 10% of the drop strengths was improved. Relative to Comparative Example 1, the display devices including the glass frit of Example 1 were improved by about 1.6 times in the average drop strength and B10 drop strength, and the display devices including the glass frit of Example 2 were improved by about 1.6 times in the average drop strength and by about 1.5 times in the B10 drop strength. Also, relative to Comparative Example 2, the display devices including the glass frit of embodiment Example 1 were improved by about 1.3 times in the average drop strength and by about 1.5 times in the B10 drop strength, and the display devices including the glass frit of embodiment Example 2 were improved by about 1.3 times in the average drop strength and by about 1.4 times in the B10 drop strength. For example, that the B10 drop strength of the display device is improved about 1.5 times is considered to mean that most of the display devices including the glass frit of embodiments of the present disclosure are improved in the drop strength in comparison to Comparative Examples 1 and 2.

Accordingly, for the glass frit according to embodiments of the present disclosure, the component, content, and physical properties may be controlled to improve the drop strength of the display device, and contribute to lifespan extension and reliability improvement of the display device.

A glass frit according to an embodiment may have a low glass transition temperature to assist a display device to have the improved drop strength, durability and reliability.

A glass frit according to an embodiment may have a low thermal expansion coefficient to assist a display device to have the improved drop strength, durability and reliability.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the subject matter of the present disclosure has been described with reference to exemplary embodiments thereof, it will be clear to those of ordinary skill in the art to which the present disclosure pertains that various changes and modifications may be made to the described embodiments without departing from the spirit and scope of the present disclosure as defined in the appended claims, and equivalents thereof.

Thus, the scope of the present disclosure shall not be restricted or limited by the foregoing description, but shall be determined by the broadest permissible interpretation of the following claims, and equivalents thereof.

What is claimed is:

1. A glass frit comprising $Bi_2O_3$, $ZnO$, $ZrO_2$, $TeO_2$, and $V_2O_5$, and having a glass transition temperature (Tg) in a range of 280° C. to 320° C.

2. The glass frit of claim 1, wherein a crystallization starting temperature (Tx) of the glass frit is in a range of 360° C. to 450° C.

3. The glass frit of claim 2, wherein a difference (Tx-Tg) between the crystallization starting temperature (Tx) and the glass transition temperature (Tg) is in a range of 80° C. to 160° C.

4. The glass frit of claim 1, wherein a thermal expansion coefficient of the glass frit is $45 \times 10^{-7}$/° C. to $55 \times 10^{-7}$/° C.

5. The glass frit of claim 1, wherein the glass frit comprises the $Bi_2O_3$ in an amount in a range of 1 mol % to 5 mol %.

6. The glass frit of claim 1, wherein the glass frit comprises:
   the $V_2O_5$ in an amount in a range of 20 mol % to 55 mol %;
   the $ZnO$ in an amount in a range of 20 mol % to 55 mol %;
   the $ZrO_2$ in an amount in a range of 1 mol % to 25 mol %;
   the $TeOV_2O_5$ in an amount in a range of 1 mol % to 20 mol %; and
   the $Bi_2O_3$ in an amount in a range of 1 mol % to 5 mol %.

7. The glass frit of claim 1, further comprising at least one selected from Fe, Cu, Mn, B, Ti and Ca.

8. The glass frit of claim 7, wherein the glass frit comprises the at least one selected from Fe, Cu, Mn, B, Ti and Ca in an amount in a range of 0.5 mol % to 25 mol %.

9. The glass frit of claim 7, further comprising $Nb_2O_5$.

10. The glass frit of claim 9, wherein the glass frit comprises the $Nb_2O^5$ in an amount in a range of 1 mol % to 10 mol %.

11. The glass frit of claim 9, wherein the glass frit comprises:
   the $V_2O_5$ in an amount in a range of 20 mol % to 55 mol %;
   the $ZnO$ in an amount in a range of 20 mol % to 55 mol %;
   the $ZrO_2$ in an amount in a range of 1 mol % to 25 mol %;
   the $Nb_2O_5$ in an amount in a range of 1 mol % to 10 mol %;
   the $TeO_2$ in an amount in a range of 1 mol % to 20 mol %;

the $Bi_2O_3$ in an amount in a range of 1 mol % to 5 mol %; and the at least one selected from Fe, Cu, Mn, B, Ti and Ca in an amount in a range of 0.5 mol % to 25 mol %.

12. The glass frit of claim 1, wherein the glass frit does not include Al.

13. The glass frit of claim 1, wherein the crystallization temperature (Tc) is in a range of 420° C. to 460° C.

14. The glass frit of claim 1, wherein a dilatometric softening point temperature (Tdsp) of the glass frit is in a range of 330° C. to 370° C.

15. A display device comprising:
a first substrate comprising a base layer and a display unit on the base layer;
a second substrate facing the first substrate; and
an encapsulation unit between the first substrate and the second substrate, and comprising a glass frit comprising $Bi_2O_3$, ZnO, $ZrO_2$, $TeO_2$, and $V_2O_5$, and having a glass transition temperature (Tg) in a range of 280° C. to 320° C.

16. The display device according to claim 15, wherein the encapsulation unit surrounds the display unit.

17. The display device according to claim 15, wherein the first substrate and the second substrate are separately arranged and the encapsulation unit is located along each flange of the first substrate and the second substrate.

18. The display device according to claim 15, wherein the glass frit further comprises,
wherein the glass frit further comprises at least one selected from Fe, Cu, Mn, B, Ti and Ca, and
wherein the glass frit comprises:
the $V_2O_5$ in an amount in a range of 20 mol % to 55 mol %, the ZnO in an amount in a range of 20 mol % to 55 mol %, the $ZrO_2$ in an amount in a range of 1 mol % to 25 mol %, the $Nb_2O_5$ in an amount in a range of 1 mol % to 10 mol %, the $TeO_2$ in an amount in a range of 1 mol % to 20 mol %, the $Bi_2O_3$ in an amount in a range of 1 mol % to 5 mol %, and the at least one selected from Fe, Cu, Mn, B, Ti and Ca in an amount in a range of 0.5 mol % to 25 mol %.

19. The display device according to claim 15, wherein the display unit comprises an organic light emitting diode, and
wherein the organic light emitting diode comprises a first electrode, a second electrode and a light emitting layer therebetween.

* * * * *

UNITED STATES PATENT AND TRADEMARK OFFICE
CERTIFICATE OF CORRECTION

PATENT NO. : 11,091,386 B2
APPLICATION NO. : 16/454874
DATED : August 17, 2021
INVENTOR(S) : Chanyoung Park et al.

It is certified that error appears in the above-identified patent and that said Letters Patent is hereby corrected as shown below:

In the Claims

Column 14, Line 44, Claim 6   Delete "$TeOV_2O_5$",
Insert --$TeO_2$--

Column 14, Line 54, Claim 10   Delete "$Nb_2O^5$",
Insert --$Nb_2O_5$--

Column 16, Line 4, Claim 19   Delete "comprises,",
Insert --comprises $Nb_2O_5$,--

Signed and Sealed this
Fourth Day of July, 2023

Katherine Kelly Vidal
*Director of the United States Patent and Trademark Office*